(12) United States Patent
Kuzuoka et al.

(10) Patent No.: US 9,184,404 B2
(45) Date of Patent: Nov. 10, 2015

(54) WHITE LIGHT-EMITTING ORGANIC ELECTROLUMINESCENT ELEMENT AND WHITE LIGHT-EMITTING ORGANIC ELECTROLUMINESCENT PANEL

(75) Inventors: Yoshikazu Kuzuoka, Osaka (JP); Hiroya Tsuji, Kyoto (JP); Hiroyuki Sasaki, Osaka (JP); Satoshi Ohara, Osaka (JP); Kazuyuki Yamae, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/006,447

(22) PCT Filed: Mar. 9, 2012

(86) PCT No.: PCT/JP2012/056134
§ 371 (c)(1),
(2), (4) Date: Sep. 20, 2013

(87) PCT Pub. No.: WO2012/128079
PCT Pub. Date: Sep. 27, 2012

(65) Prior Publication Data
US 2014/0008632 A1   Jan. 9, 2014

(30) Foreign Application Priority Data
Mar. 24, 2011   (JP) ................................. 2011-066567

(51) Int. Cl.
*H01L 29/08*       (2006.01)
*H01L 35/24*       (2006.01)
(Continued)

(52) U.S. Cl.
CPC ........ *H01L 51/5024* (2013.01); *H01L 27/3209* (2013.01); *H01L 51/5036* (2013.01)

(58) Field of Classification Search
CPC .......................... H01L 51/504; H01L 51/5024
USPC ........ 257/40, 59, 72, 759, E27.117, E51.001, 257/E51.002, E51.007, E51.022, E51.024; 178/17 D, 19.03; 313/483, 500, 504, 313/509; 345/39, 46, 82, 204–206, 694; 349/38, 39, 51, 52
See application file for complete search history.

(56) References Cited

U.S. PATENT DOCUMENTS
5,891,554 A   4/1999  Hosokawa et al.
6,107,734 A   8/2000  Tanaka et al.
(Continued)

FOREIGN PATENT DOCUMENTS
JP   7-240277      9/1995
JP   11-329748    11/1999
(Continued)

OTHER PUBLICATIONS
"Organic electroluminescence materials and displays", CMC Publishing Co., Ltd., pp. 298-310 (Feb. 2001), and a partial English translation thereof.
(Continued)

*Primary Examiner* — Meiya Li
*Assistant Examiner* — Peter M Albrecht
(74) *Attorney, Agent, or Firm* — Greenblum & Bernstein, P.L.C.

(57) ABSTRACT
A white light-emitting organic electroluminescent element includes at least four kinds of light-emitting dopants with different emission peak wavelengths which are present between a cathode and an anode. The four kinds of light-emitting dopants include a light-emitting dopant "A", a light-emitting dopant "B", a light-emitting dopant "C", and a light-emitting dopant "D" having their own peak wavelengths which are longer in this order. The white light-emitting organic electroluminescent element has an emission spectrum which satisfies relations of: (first average luminance for an angle in a range of 50° to 70°/first front luminance)> (second average luminance for an angle in a range of 50° to 70°/second front luminance); and (third average luminance for an angle in a range of 50° to 70°/third front luminance)> (fourth average luminance for an angle in a range of 50° to 70°/fourth front luminance).

13 Claims, 5 Drawing Sheets

(51) Int. Cl.
*H01L 51/00* (2006.01)
*H01L 51/50* (2006.01)
*H01L 27/32* (2006.01)

(56) References Cited

U.S. PATENT DOCUMENTS

| | | | |
|---|---|---|---|
| 6,124,024 | A | 9/2000 | Hosokawa et al. |
| 6,506,901 | B2 | 1/2003 | Steffan et al. |
| 6,717,358 | B1 | 4/2004 | Liao et al. |
| 7,109,651 | B2 | 9/2006 | Nakamura et al. |
| 8,080,934 | B2 | 12/2011 | Kido et al. |
| 8,350,281 | B2 | 1/2013 | Fukuda |
| 2003/0189401 | A1 | 10/2003 | Kido et al. |
| 2004/0195962 | A1 | 10/2004 | Nakamura et al. |
| 2007/0182317 | A1 | 8/2007 | Kido et al. |
| 2007/0200124 | A1* | 8/2007 | Suzuri et al. ............ 257/89 |
| 2010/0301317 | A1 | 12/2010 | Nowatari et al. |
| 2010/0314638 | A1 | 12/2010 | Fukuda |
| 2012/0132895 | A1 | 5/2012 | Kido et al. |
| 2013/0045553 | A1 | 2/2013 | Fukuda |
| 2013/0306949 | A1 | 11/2013 | Nowatari et al. |

FOREIGN PATENT DOCUMENTS

| | | |
|---|---|---|
| JP | 2000-243573 | 9/2000 |
| JP | 03-272860 | 9/2003 |
| JP | 2004-281371 | 10/2004 |
| JP | 2004-296423 | 10/2004 |
| JP | 2004-335183 | 11/2004 |
| JP | 2006-049393 | 2/2006 |
| JP | 2006-165271 | 6/2006 |
| JP | 2010-287524 | 12/2010 |
| JP | 2010-539653 | 12/2010 |
| JP | 2010-541160 | 12/2010 |
| JP | 2011-9199 | 1/2011 |
| JP | 2011-049356 | 3/2011 |
| WO | 2005/094130 | 10/2005 |
| WO | 2009/038704 | 3/2009 |
| WO | 2009/045273 | 4/2009 |
| WO | 2010/137477 | 12/2010 |

OTHER PUBLICATIONS

"Organic electroluminescence handbook", Realize Science & Engineering Center / Sipec Co., Ltd., pp. 203-228 (Jun. 2004), and a partial English translation thereof.

International Search Report in PCT/JP2012/056134, mail date is Jun. 12, 2012.

* cited by examiner

FIG. 1

Radiation patterns in cases where n<1.0, n=1.0, and n>1.0

WHITE LIGHT-EMITTING ORGANIC ELECTROLUMINESCENT ELEMENT AND WHITE LIGHT-EMITTING ORGANIC ELECTROLUMINESCENT PANEL

TECHNICAL FIELD

The present invention relates to: a white light-emitting organic electroluminescent element having high light-emitting efficiency (luminance efficacy) and particularly high light-extracting efficiency to the outside; and a white light-emitting organic electroluminescent panel as a planar light source with high efficiency using the white light-emitting organic electroluminescent element.

BACKGROUND ART

Each of an electroluminescent element and a light-emitting diode having a light-emitting layer interposed between electrodes to obtain electroluminescence has been vigorously developed not only for application to a display device but also for application to various types of light sources such as a planar lighting, a light source for optical fiber, a backlight unit for a liquid crystal display, and a backlight unit for a liquid crystal projector.

In particular, an organic electroluminescent element is excellent in light-emitting efficiency, low-voltage drive, weight, and cost and has attracted attention in recent years. Device structure, material, a driving method, a manufacturing method, and the like have been developed in order to obtain light-emitting efficiency comparable to fluorescent lamps for application to lighting.

However, in an inter-solid light-emitting element (e.g., organic electroluminescent element) designed to allow light to be extracted from the light-emitting layer per se, if the light has an angle not lower than a critical angle, the light is totally reflected and is confined in the inside and is consequently lost as guided light. The critical angle depends on refractive indexes of the light-emitting layer and an emitting medium.

According to the Snell's law, a light-extracting efficiency η that is an efficiency of extraction of light to an outside is approximated with an equation of $\eta=1/(2n^2)$ where n denotes the refractive index of the light-emitting layer. Provided that the refractive index of the light-emitting layer is 1.7 which is a representative value among refractive indexes of organic compounds, η is about 17% and not less than 80% of the emission light is lost as guided light, that is, as lost-light towards a side direction of the element.

In order to extract such guided light, a region for disordering reflective and refractive angles and for disturbing the Snell's law is required between an emission face and the light-emitting layer so as to change a transmission angle of light that is otherwise totally reflected as guided light. Alternatively, the emission light is required to have a light-harvesting property.

In typical organic electroluminescent elements described in Patent Literatures 1 and 2, a thickness of an electron transporting light-emitting layer is in a range of several tens nm to one hundred and several tens nm and has the same orders of visible light wavelengths. Therefore, light waves (light) emitted consequently to the outside interfere with each other destructively or constructively depending on a distance d between a light-emitting region and a reflective electrode. Although light emitted along a normal direction of the element is only shown in FIG. 13 in Patent Literature 1, light emitted along an oblique direction is also present actually. Conditions for interference vary depending on the angle of the light as well as the distance d and an emission wavelength λ. Therefore, a case where light waves emitted along the normal direction interfere with each other constructively and light waves emitted along a wide-angle direction interfere with each other destructively may occur, or the opposite case may occur. In other words, luminance of the emission light varies depending on the viewing angle.

Patent Literature 1 and Patent Literature 2 discloses a method for improving light-emitting efficiency of an organic electroluminescent element having a light diffusion structure, by designing to satisfy the following formula (1) in luminance distribution of the light-extracting face of the organic electroluminescent element before formation of the aforementioned structure for extracting guided light, and subsequently by forming the light diffusion structure or the like on the light-extracting face of this element.

$$\text{Front luminance} < (\text{luminance for an angle in a range of } 50° \text{ to } 70°) \quad (1)$$

In this invention, in a state that no light diffusion layer is formed, light waves along the normal direction are designed to interfere destructively but guided light waves confined in the inside of the element are designed to interfere constructively. In this way, the invention indicates that, in order to improve the light-emitting efficiency of the organic electroluminescent element, the light diffusion layer should be formed on the organic electroluminescent element having a basic structure designed to cause constructive interference in light (a wide angle component light), which is usually confined in the element as guided light, so as to amplify the guided light, which consists a greater part of light, rather than on a basic structure designed to cause constructive interference in light along the normal direction that can be emitted to the outside.

Note that the formula (1) may be converted into the following formula (2).

$$(\text{An average luminance for an angle in a range of } 50° \text{ to } 70°)/\text{a frontal luminance} > 1 \quad (2)$$

Moreover, Patent Literature 2 discloses that, in an organic electroluminescent element having light-emitting layers of different colors, a distance between a cathode and a light-emitting layer, which has poor efficiency, is optimized. For application of the organic electroluminescent element to lighting, it is preferable not only that light-emitting efficiency is high but also that viewing angle dependence of an emission color is low. Uniform viewing angle dependences of the emission intensities of emission colors ideally provide no viewing angle dependence of the white light-emitting organic electroluminescent. However, not uniform viewing angle dependences of the emission intensities of emission colors are required for adjusting the light-emitting efficiencies of emission colors by using an effect of optical interference as shown in Patent Literature 2.

As described in Patent Literature 3, it is generally known that the viewing angle dependence of the emission color is suppressed by forming a light scattering layer having light scattering property on the light-extracting face of the organic electroluminescent element. Therefore, the viewing angle dependence is furthermore reduced by forming the light diffusion layer in the organic luminescent element having the viewing angle dependence of the emission color that has been already reduced without the light diffusion layer.

CITATION LIST

Patent Literature

Patent Literature 1: JP2004-296423 A
Patent Literature 2: JP2004-335183 A
Patent Literature 3: WO2005/094130 A1

SUMMARY OF INVENTION

Technical Problem

The invention has been achieved in view of circumference, and an object thereof is to propose: a white light-emitting organic electroluminescent element with improved viewing angle dependence and high efficiency; and a white light-emitting organic electroluminescent panel including the element.

Solution to Problem

A white light-emitting organic electroluminescent element in accordance with the present invention includes at least four kinds of light-emitting dopants with different emission peak wavelengths which are present between a cathode and an anode, wherein the four kinds of light-emitting dopants include a light-emitting dopant "A", a light-emitting dopant "B", a light-emitting dopant "C", and a light-emitting dopant "D" having their own peak wavelengths which are longer in this order. The white light-emitting organic electroluminescent element has an emission spectrum which satisfies relations of (first average luminance for an angle in a range of 50° to 70°/first front luminance)>(second average luminance for an angle in a range of 50° to 70°/second front luminance); and (third average luminance for an angle in a range of 50° to 70°/third front luminance)>(fourth average luminance for an angle in a range of 50° to 70°/fourth front luminance). (The first average luminance for the angle in the range of 50° to 70°) is defined as average luminance for the angle in the range of 50° to 70° at the peak wavelength of the light-emitting dopant "A". (The first front luminance) is defined as front luminance at the peak wavelength of the light-emitting dopant "A". (The second average luminance for an angle in a range of 50° to 70°) is defined as average luminance for the angle in the range of 50° to 70° at the peak wavelength of the light-emitting dopant "D". (The second front luminance) is defined as front luminance at the peak wavelength of the light-emitting dopant "D". (The third average luminance for an angle in a range of 50° to 70°) is defined as average luminance for the angle in the range of 50° to 70° at the peak wavelength of the light-emitting dopant "C". (The third front light luminance) is defined as front luminance at the peak wavelength of the light-emitting dopant "C". (The fourth average luminance for an angle in a range of 50° to 70°) is defined as average luminance for the angle in the range of 50° to 70° at the peak wavelength of the light-emitting dopant "B". (The fourth front light luminance) is defined as a front luminance at the peak wavelength of the light-emitting dopant "B".

In the white light-emitting organic electroluminescent element, it is preferable that the peak wavelength of the light-emitting dopant "B" is between 480 nm and 520 nm and the peak wavelength of the light-emitting dopant "C" is between 520 nm and 580 nm.

In the white light-emitting organic electroluminescent element, it is preferable the light-emitting dopant "A" is a blue light-emitting dopant and the light-emitting dopant "D" is a red light-emitting dopant.

In the white light-emitting organic electroluminescent element, a relation of (the first average luminance for the angle in the range of 50° to 70°/the first front luminance)>1 is satisfied.

In the white light-emitting organic electroluminescent element, it is preferable that a relation of (the second average luminance for the angle in the range of 50° to 70°/the second front luminance)<1 is satisfied.

It is preferable that the white light-emitting organic electroluminescent element further includes two light-emitting units and an intermediate connecting layer connecting the light-emitting units which are disposed between the cathode and the anode wherein the two light-emitting units are a first light-emitting unit containing the light-emitting dopant "A" and a second light-emitting unit containing the light-emitting dopant "C" and the light-emitting dopant "D".

In the white light-emitting organic electroluminescent element, it is preferable that the first light-emitting unit containing the light-emitting dopant "A" further contains the light-emitting dopant "B", and the light-emitting dopant "B" is a singlet light-emitting material.

In the white light-emitting organic electroluminescent, it is preferable that the second light-emitting unit containing the light-emitting dopants "C" and "D" further contains the light-emitting dopant "B", and the light-emitting dopant "B" is a triplet light-emitting material.

In the white light-emitting organic electroluminescent element, it is preferable that the light-emitting dopant "A" is a singlet light-emitting material and the light-emitting dopants "C" and "D" are triplet light-emitting materials.

In the white light-emitting organic electroluminescent element, it is preferable that one of the anode and the cathode is a reflective electrode, and the first lighting emitting unit is far from the reflective electrode than the second light-emitting unit is, and the white light-emitting organic electroluminescent element is designed to emit white light having a correlated color temperature in a range of 2000 K to 4500 K.

In the white light-emitting organic electroluminescent element, it is preferable that the emission spectrum is derived from only the four kinds of the light-emitting dopants.

A white light-emitting organic electroluminescent panel in accordance with the present invention includes the white light-emitting organic electroluminescent element and a light diffusion layer that is designed to scatter light and disposed on a light-extracting face of the white light-emitting organic electroluminescent element.

Advantageous Effects of Invention

According to present invention, it is possible to reduce viewing angle dependence and improve efficiency (luminance efficacy).

DESCRIPTION OF EMBODIMENTS

Hereinafter, embodiments of the present invention will be described.

In the present specification, an organic electroluminescent element is defined as a light-emitting device that has an organic light-emitting layer interposed between an anode and a cathode, which face with each other, and has no light diffusion layer on a light-extracting face. Moreover, an organic electroluminescent panel is defined as a light-emitting device including this organic electroluminescent element and the light diffusion layer disposed on the light-extracting face of the organic electroluminescent element.

A white light-emitting organic electroluminescent element includes multiple light-emitting dopants, which have emission peaks and are present between the cathode and the anode. The light-emitting dopants include at least four kinds of light-emitting dopants having different peak wavelengths (peak emission wavelengths). The four kinds of light-emitting dopants include a light-emitting dopant "A", a light-emitting dopant "B", a light-emitting dopant "C", and a light-emitting dopant "D" having their own peak wavelengths which are longer in this order. It is preferable that an emission spectrum of the white light-emitting organic electroluminescent element practically consists of the emission spectra derived from the four kinds of light-emitting dopants. Thus, it is possible to reduce viewing angle dependence and improve efficiency.

If the white light-emitting organic electroluminescent element includes five kinds of light-emitting dopants, it is basically preferable that light-emitting dopants having the first to the fourth highest external quantum efficiencies are selected from the five kinds as the four kinds of the light-emitting dopants "A", "B", "C", and "D", while there are five combinations for selecting four kinds of light-emitting dopants out of five kinds and the four kinds of light-emitting dopants "A", "B", "C", and "D" need to satisfy that their peak wavelengths are longer in this order. In a case where the element includes six kinds of light-emitting dopants or more, it is preferable that the four kinds of light-emitting dopants are selected in the same manner.

The white light-emitting organic electroluminescent element has the emission spectrum which satisfies conditions defined by the following formulae (F1) and (F2).

A quotient (in the peak wavelength of the light-emitting dopant "$A$") of an average luminance for an angle in a range of 50° to 70° divided by a front luminance>a quotient (in the peak wavelength of the light-emitting dopant "$D$") of an average luminance for an angle in a range of 50° to 70° divided by a front luminance  (F1)

A quotient (in the peak wavelength of the light-emitting dopant "$C$") of an average luminance for an angle in a range of 50° to 70° divided by a front luminance)>a quotient (in the peak wavelength in the light-emitting dopant "$B$") of an average luminance for an angle in a range of 50° to 70° divided by a front luminance  (F2)

In the white light-emitting organic electroluminescent element, it is possible to reduce viewing angle dependence and improve light-emitting efficiency by satisfying conditions defined by the formulae (F1) and (F2).

Note that "(the peak wavelength of the light-emitting dopant "A")" means a range of the peak wavelength in the light-emitting dopant "A"±1 nm. As for light-emitting dopants "B", "C", and "D", the same manner is adopted. In other words, "(the peak wavelength of the light-emitting dopant "B")" means a range of the peak wavelength of the light-emitting dopant "B"±1 nm, "(The peak wavelength of the light-emitting dopant "C")" means a range of the peak wavelength of the light-emitting dopant "C"±1 nm, and "(the peak wavelength of the light-emitting dopant "D")" means a range of the peak wavelength of the light-emitting dopant "D"±1 nm. For example, provided that a peak wavelength of a light-emitting dopant is 400 nm, a quotient of an average luminance for an angle in a range of 50° to 70° divided by a front luminance is measured and calculated in a range of 400 nm±1 nm. This wavelength resolution (±1 nm) is obtained without any problem when a general luminance colorimeter (e.g., SR-3 available from TOPCON TECHNOHOUSE CORPORATION) is used for measurement of an emission spectrum. Luminance in "a quotient of an average luminance for an angle in a range of 50° to 70° divided by a front luminance" refers to luminance in a peak wavelength of a light-emitting dopant in the white organic electroluminescent element, which does not include the light diffusion layer. "An average luminance for an angle in a range of 50° to 70°" is the arithmetic mean of measured values of luminance in a range of 50° to 70° inclined against 0°, which is normal to the white light-emitting organic electroluminescent element. "The front luminance" is defined as luminance at 0° (that is, luminance at the front of the element), which is normal to the white light-emitting organic electroluminescent element.

The aforementioned formula (F1) may be converted into the following formula (F1').

(First average luminance for an angle in a range of 50° to 70°/first front luminance)>(second average luminance for an angle in a range of 50° to 70°/second front luminance)  (F1')

Note that "the first average luminance for an angle in a range of 50° to 70°" is defined as the average luminance for the angle in the range of 50° to 70° (50 to 70 degrees) at the peak wavelength of the light-emitting dopant "A". "The first front luminance" is defined as the front luminance at the peak wavelength of the light-emitting dopant "A". "The second average luminance for an angle in a range of 50° to 70°" is defined as the average luminance for the angle in the range of 50° to 70° at the peak wavelength of the light-emitting dopant "D". "The second front luminance" is defined as the front luminance at the peak wavelength of the light-emitting dopant "D".

The aforementioned formula (F2) may be converted into the following formula (F2').

(Third average luminance for an angle in a range of 50° to 70°/third front luminance)>(fourth average luminance for an angle in a range of 50° to 70°/fourth front luminance)  (F2')

Note that "the third average luminance for an angle in a range of 50° to 70°" is defined as the average luminance for the angle in the range of 50° to 70° at the peak wavelength of the light-emitting dopant "C". "The third front light luminance" is defined as the front luminance at the peak wavelength of the light-emitting dopant "C". "The fourth average luminance for an angle in a range of 50° to 70°" is defined as the average luminance for the angle in the range of 50° to 70° at the peak wavelength of the light-emitting dopant "B". "The fourth front light luminance" is defined as the front luminance at the peak wavelength of the light-emitting dopant "B".

In the aforementioned white light-emitting organic electroluminescent element containing four kinds of the light-emitting dopants "A", "B", "C", and "D" interposed between the cathode and the anode, it is preferable that the peak wavelength of the light-emitting dopant "B", which is the second longest peak wavelength, is in a range of 480 nm to 520 nm and the peak wavelength of the light-emitting dopant "C", which is the third longest peak wavelength, is in a range of 520 nm to 580 nm. Owing to this configuration, the viewing angle dependence is further improved. In this case, it is preferable that the light-emitting dopant "A" is a blue light-emitting dopant of which peak wavelength is shorter than that of the light-emitting dopant "B", and the light-emitting dopant "D" is a red light-emitting dopant of which peak wavelength is longer than that of the light-emitting dopant "C".

In the white light-emitting organic electroluminescent element, it is preferable that a relation of the quotient (in the peak wavelength of the light-emitting dopant "A") of the average luminance for the angle in the range of 50° to 70° divided by the front luminance>1 is satisfied. In other words, it is preferable that a relation of (the first average luminance for the angle in the range of 50° to 70°/the first front luminance)>1 is satisfied. The light-emitting dopant "A" is a short wavelength light-emitting dopant that is likely to have lower light-emitting efficiency (luminance efficacy) than other light-emitting dopants contained in light-emitting layers. Therefore, for example, the efficiency of the white light-emitting organic electroluminescent element is preferably improved by such a configuration after formation of the light diffusion layer.

In the white light-emitting organic electroluminescent element, it is preferable that a relation of the quotient (in the peak wavelength of the light-emitting dopant " D") of the average luminance for the angle in the range of 50° to 70° divided by the front luminance<1 is satisfied. In other words, it is preferable that a relation of (the second average luminance for the angle in the range of 50° to 70° /the second front luminance) <1 is satisfied. The light-emitting dopant "D" is a long wavelength light-emitting dopant that is likely to have higher emission efficacy than that of other light-emitting dopants contained in light-emitting layers. Therefore, it is preferable to suppress an improvement on the efficiency of the white light-emitting organic electroluminescent element by such a configuration, for example, after formation of the light diffusion layer.

Figure 7A:
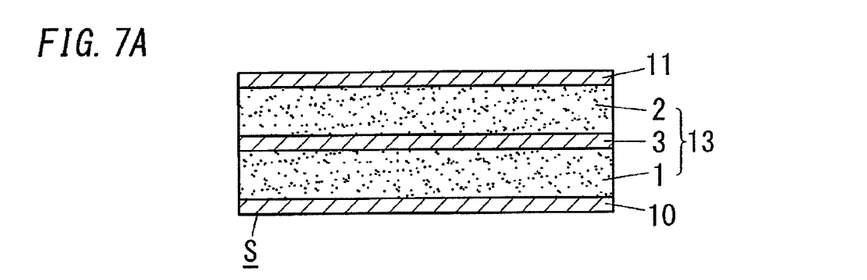
FIG. 7A is a sectional view showing an example of the white light-emitting organic electroluminescent element.

In an embodiment of the organic electroluminescent element in accordance with the present invention, it is preferable that two light-emitting units (a first light-emitting unit 1 and second light-emitting unit 2) are formed as an organic light-emitting layer 13 between an anode 10 and a cathode 11 as shown in FIG. 7A. Moreover, it is preferable that the organic light-emitting layer 13 includes an intermediate connecting layer (interlayer) 3 connecting the two light-emitting units 1 and 2. Furthermore, it is preferable that the light-emitting unit 1 contains the light-emitting dopant "A" for blue and the light-emitting unit 2 contains the light-emitting dopant "C" for green and the light-emitting dopant "D" for red. It is preferable that the light-emitting dopant "A" is a singlet light-emitting material and the light-emitting dopants "C" and "D" are triplet light-emitting materials. In order to extend lifetime of the element, it is preferable that the blue light-emitting dopant "A" is a singlet material because a triplet material as a blue light-emitting material has relatively short lifetime. A blue light-emitting material, which is a singlet material, is likely to have relatively low light-emitting efficiency (luminance efficacy) than other materials contained in light-emitting layers. However, it is possible to improve efficiency by satisfying conditions defined as the formulae (F1) and (F2) ((F1') and (F2')) described above, and thereby obtaining a white organic electroluminescent element with long lifetime and high efficiency. When the light-emitting dopant "B" is a singlet light-emitting material, the light-emitting dopant "B" is preferably contained in the light-emitting unit 1 containing the light-emitting dopant "A", which is also a singlet light-emitting material. When the light-emitting dopant "B" is a triplet light-emitting material, the light-emitting dopant "B" is preferably contained in the light-emitting unit 2 containing the light-emitting dopants "C" and "D", which are also triplet light-emitting materials.

The aforementioned "light-emitting unit" is defined as components for constituting an ordinary organic electroluminescent element other than the cathode and the anode. Examples of "the components for constituting an ordinary organic electroluminescent element" include (an anode)/a light-emitting layer/(a cathode), (an anode)/a hole transport layer/a light-emitting layer/(a cathode), (an anode)/a hole transport layer/a light-emitting layer/an electron transport layer/(a cathode), and (an anode)/a hole injection layer/a hole transport layer/a light-emitting layer/an electron transport layer/an electron injection layer/(a cathode). Additionally, "the intermediate connecting layer" described above is a layer connecting the aforementioned light-emitting units 1 and 2. The intermediate connecting layer may be selected from conventional components such as, an intermediate conductive layer including a transparent conductive film described in JP1999-329748 A, an intermediate electrode described in JP1999-329748 A, a charge generation layer described in JP2003-272860 A, a doped connector described in JP2004-281371 A, and a charge extraction layer and an adjacent layer described in JP2006-49393 A, but is preferably configured by an organic compound film or an organic compound film doped with a dopant, that is, no metal film and no metal oxide film for facilitating optical design and suppressing a difference between refractive indexes of the organic light-emitting layer and the intermediate connecting layer.

Moreover, in an embodiment of the aforementioned white light light-emitting organic electroluminescent element, it is preferable that one of the anode 10 and the cathode 11 is a reflective electrode. In this case, the light-emitting unit 1 is far from the reflective electrode than the light-emitting unit 2 is. Moreover, the white light-emitting organic electroluminescent element emits white light having a correlated color temperature in a range of 2000 K to 4500 K where red is relatively dominant. In this white light-emitting organic electroluminescent element, it is possible to improve efficiency and reduce viewing angle dependence. It is more preferable that the anode 10 is a transparent electrode and the cathode 11 is the reflective electrode.

Figure 7B:
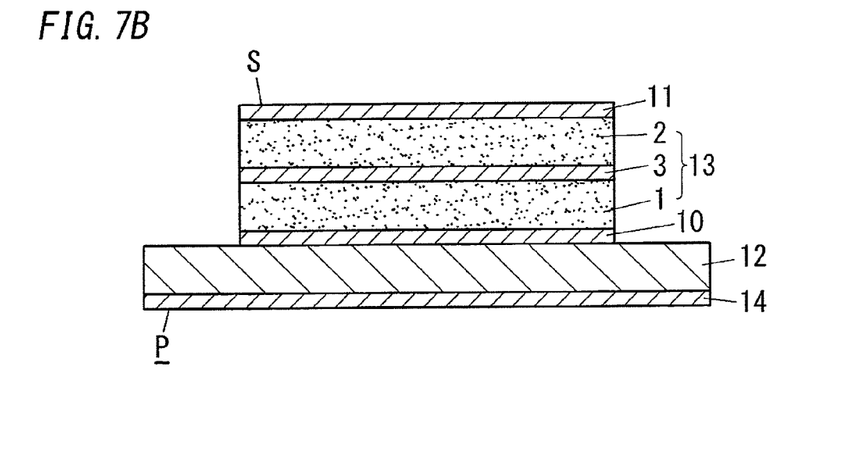
FIG. 7B is a sectional view showing an example of the white light-emitting organic electroluminescent panel.

In the white light-emitting organic electroluminescent panel in accordance with the present invention, the light diffusion layer is designed to scatter light and disposed on the light-extracting face of the white light-emitting organic electroluminescent element. The "light diffusion layer" is not particularly limited as long as can efficiently change a transmission angle of light that is equal to or more than total reflection angle into less than the total reflection angle and can force guided light, which is confined inside the element, to be emitted more to the outside. As the "light diffusion layer", conventional light diffusion layers shown in JP2004-335183 A, JP2004-296423 A, or the like are used. The total light transmittance of the light diffusion layer is preferably in a range of 55% to 85%. The light diffusion layer is formed on the light-extracting face (the face from which the light of the organic light-emitting layer is emitted to the outside). The light-extracting face is set in any position other than between the anode 10 and the cathode 11. For example as shown in FIG. 7B, a diffusion film as a light diffusion layer 14 is bonded on a surface (light-extracting face), other than the surface on which the transparent anode 10 such as ITO is formed, of a supporting substrate 12 by means of an adhesive.

In other examples, the supporting substrate 12 on which the white light-emitting organic electroluminescent element is disposed has a light diffusion property, or the light diffusion layer 14 is interposed between the transparent electrode and the supporting substrate.

Such a light diffusion layer reduces viewing angle dependence.

Hereinafter, a result of verification for the present invention based on numerical calculation will now be described.

First, a method for the numerical calculation will be described. A shape of emission spectrum is defined as Gaussian G (λp, σ) of which the peak value is normalized as 1, where λp [nm] denotes the peak wavelength and σ denotes the standard deviation.

Then, angular dependence D(θ) of radiance is defined as an equation of D(θ,n)=cos"(θ), where θ denotes an angle between a normal direction (front direction) of a planar light source (white light-emitting organic electroluminescent element) and a direction from the light source to a detector.

Provided that n=1 in the above formula, the radiation distribution of the planar light source is Lambertian distribution, which is normally assumed.

Provided that n>1, a relation of an average radiance for an angle in a range of 50° to 70° (50 to 70 degrees)<a radiance in a normal direction (0 degrees direction) is satisfied.

Provided that n=1, a relation of an average radiance for an angle in a range of 50° to 70°=a radiance in a normal direction is satisfied.

Provided that n<1, a relation of an average radiance for an angle in a range of 50° to 70°>a radiance in a normal direction is satisfied.

Figure 1:
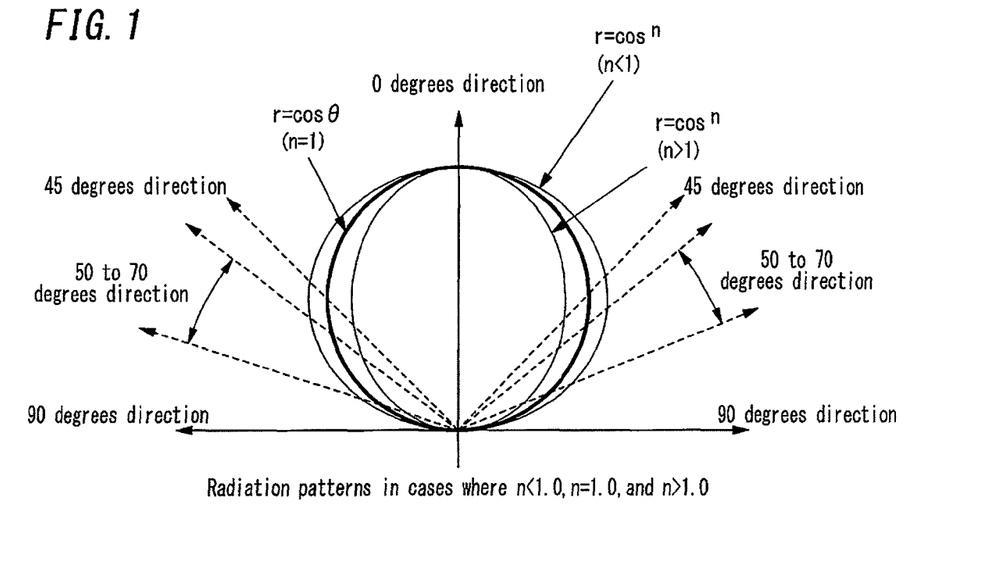
FIG. 1 is an explanatory drawing for a radiation pattern in an embodiment in accordance with the present invention.

FIG. 1 shows the radiation distributions in the respective cases of n<1, n=1, and n>1. In the numerical calculation, a relation of 0<cos(θ)<1 [0°≤θ≤90°] is satisfied. Given 0<n1<n2, a relation of a quotient (n=n1) of the average radiance for the angle in the range of 50° to 70° divided by the radiance in the normal direction>a quotient (n=n2) of the average radiance for the angle in the range of 50° to 70° divided by the radiance in the normal direction is satisfied.

Lambertian is defined as radiation distribution in which radiance in the normal direction equals to radiance in the respective directions.

Spectrum S(λ,θ) is a synthetic spectrum of four kinds of emission spectra measured at an angle θ is defined as the following formula (3).

[Math. 1]

$$S(\lambda, \theta) = P_A \times D(\vartheta, n_A) \times G(\lambda_{pA}, \sigma_A) + P_B \times D_B(\vartheta, n_B) \times G(\lambda_{pB}, \sigma_B) + \\ P_C \times D_C(\vartheta, n_C) \times G(\lambda_{pc}, \sigma_C) + P_D \times D_D(\vartheta, n_D) \times G(\lambda_{pD}, \sigma_D)$$ (3)

$P_A$, $P_B$, $P_C$, and $P_D$, are amounts in proportion to emission intensities of the light-emitting dopants "A", "B", "C", and "D", respectively. $D(\theta, n_A)$, $D_B(\theta, n_B)$, $D_C(\theta, n_C)$, and $D_D(\theta, n_D)$ respectively denote angular dependences of the radiances of the light-emitting dopants "A", "B", "C", and "D". Moreover, $\lambda_{pA}$, $\lambda_{pB}$, $\lambda_{pC}$, and $\lambda_{pD}$ respectively denote the peak wavelengths (nm) of the light-emitting dopants "A", "B", "C", and "D". Furthermore, $\sigma_A$, $\sigma_B$, $\sigma_C$, and $\sigma_D$ respectively denote the standard deviations of the emission spectra of the light-emitting dopants "A", "B", "C", and "D".

Table 1 shows conditions for calculating spectra (e.g., the peak wavelength, the standard deviation of the emission spectrum, the peak intensity, and the angular dependence of the radiance). Moreover, Table 1 shows a difference in chromaticity derived from observation angles under the conditions. In all of the spectra in Table 1, spectra in the normal direction coincide. Therefore, with regard to the aforementioned four conditions shown in Table 1, there is no difference for the calculation conditions other than angular dependences of the emission intensities of emission colors.

TABLE 1

|   |   | S1 | S2 | S3 | S4 |
|---|---|---|---|---|---|
| A | Center wavelength $\lambda_{pA}$ (nm) | | 450 | | |
|   | Standard deviation $\sigma_A$ (nm) | | 20 | | |
|   | Intensity $P_A$ | | 0.2 | | |
|   | $n_A$ | | 0.8 | | |
| B | Center wavelength $\lambda_{pB}$ (nm) | | 520 | | |
|   | Standard deviation $\sigma_B$ (nm) | | 20 | | |
|   | Intensity $P_B$ | | 0.6 | | |
|   | $n_B$ | 1.0 | 1.3 | 0.9 | 1.1 |
| C | Center wavelength $\lambda_{pC}$ (nm) | | 570 | | |
|   | Standard deviation $\sigma_C$ (nm) | | 20 | | |
|   | Intensity $P_C$ | | 0.5 | | |
|   | $n_C$ | 1.3 | 1.0 | 1.1 | 0.9 |
| D | Center wavelength $\lambda_{pD}$ (nm) | | 615 | | |
|   | Standard deviation $\sigma_D$ (nm) | | 20 | | |
|   | Intensity $P_D$ | | 20 | | |
|   | $n_D$ | | 1.3 | | 1.2 |
| Front chromaticity (CIE.x, CIE.y) | | 0.431, 0.438 | 0.431, 0.438 | 0.431, 0.438 | 0.431, 0.438 |
| Chromaticity change CIE.x | | 0.066 | 0.032 | 0.055 | 0.031 |
| Chromaticity change CIE.y | | 0.025 | 0.034 | 0.006 | 0.013 |
| Front chromaticity u', v' | | 0.233, 0.533 | 0.233, 0.533 | 0.233, 0.533 | 0.233, 0.533 |
| Chromaticity change u' | | 0.031 | 0.007 | 0.031 | 0.014 |
| Chromaticity change v' | | 0.019 | 0.017 | 0.010 | 0.009 |
| Δ(x, y) | | 0.071 | 0.047 | 0.055 | 0.033 |
| Δ(u', v') | | 0.036 | 0.019 | 0.032 | 0.016 |

Given $n_A=0.8$, $n_D=1.3$ with regard to both of S1 and S2, the relation of the quotient (in the peak wavelength of the light-emitting dopant "A") of the average luminance for the angle in the range of 50° to 70° divided by the front luminance>the quotient (in the peak wavelength of the light-emitting dopant "D") of the average luminance for the angle in the range of 50° to 70° divided by the front luminance is satisfied.

Given $n_B=1.0$, $n_C=1.3$ with regard to S1, the relation of the quotient (in the peak wavelength of the light-emitting dopant "C") of the average luminance for the angle in the range of 50° to 70° divided by the front luminance<the quotient (in the peak wavelength of the light-emitting dopant "B") of the average luminance for the angle in the range of 50° to 70° divided by the front luminance is satisfied in S1.

Given $n_B=1.3$, $n_C=1.0$ with regard to S2, the relation of the quotient (in the peak wavelength of the light-emitting dopant "C") of the average luminance for the angle in the range of 50° to 70° divided by the front luminance>the quotient (in the peak wavelength of the light-emitting dopant "B") of the average luminance for the angle in the range of 50° to 70° divided by the front luminance is satisfied in S2.

Comparison between S1 and S2 concludes that S2 has a small viewing angle dependence of the emission color in each of the CIE standard colorimetric system and the u'v' colorimetric system.

With regard to S3 and S4 having different angular dependences, viewing angle dependences of the emission colors were examined in a similar manner.

In both of S3 and S4, the relation of the quotient (in the peak wavelength of the light-emitting dopant "A") of the average luminance for the angle in the range of 50° to 70° divided by the front luminance >the quotient (in the peak wavelength of the light-emitting dopant "D") of the average luminance for the angle in the range of 50° to 70° divided by the front luminance is satisfied.

Given $n_B=0.9$, $n_c=1.2$ with regard to S3, the relation of the quotient (in the peak wavelength of the light-emitting dopant "C") of the average luminance for the angle in the range of 50° to 70° divided by the front luminance <the quotient (in the peak wavelength of the light-emitting dopant "B") of the average luminance for the angle in the range of 50° to 70° divided by the front luminance is satisfied in S3.

Given $n_B=1.2$, $n_C=0.9$ with regard to S4, the relation of the quotient (in the peak wavelength of the light-emitting dopant "C") of the average luminance for the angle in the range of 50° to 70° divided by the front luminance >the quotient (in the peak wavelength of the light-emitting dopant "B") of the average luminance for the angle in the range of 50° to 70° divided by the front luminance is satisfied in S4.

Comparison between S3 and S4 concludes that S4 has a small viewing angle dependence of the emission color in each of the CIE standard colorimetric system and the u'v' colorimetric system. In other words, the configuration satisfying the following relations is concluded as effective for reducing viewing angle dependence: the quotient (in the peak wavelength of the light-emitting dopant "A") of the average luminance for the angle in the range of 50° to 70° divided by the front luminance>the quotient (in the peak wavelength of the light-emitting dopant "D") of the average luminance for the angle in the range of 50° to 70° divided by the front luminance; and the quotient (in the peak wavelength of the light-emitting dopant "C") of the average luminance for the angle in the range of 50° to 70° divided by the front luminance>the quotient (in the peak wavelength of the light-emitting dopant "B") of the average luminance for the angle in the range of 50° to 70° divided by the front luminance.

The angular dependences shown in Table 1 are the respective angular dependences of the light-emitting dopants when they are used alone. In a condition that the light-emitting dopants (e.g., four kinds of the light-emitting dopants) are mixed, with regard to the peak wavelength of the light-emitting dopant, magnitude relations between the following quotients are slightly affected: the quotient (in the peak wavelength of the light-emitting dopant "A") of the average luminance for the angle in the range of 50° to 70° divided by the front luminance and the quotient (in the peak wavelength of the light-emitting dopant "D") of the average luminance for the angle in the range of 50° to 70° divided by the front luminance; and the quotient (in the peak wavelength of the light-emitting dopant "C") of the average luminance for the angle in the range of 50° to 70° divided by the front luminance and the quotient (in the peak wavelength of the light-emitting dopant "B") of the average luminance for the angle in the range of 50° to 70° divided by the front luminance. Moreover, in the mixed condition, the angular dependence of the peak wavelength of the light-emitting dopant is affected by angular dependences of other light-emitting dopants in comparison with the angular dependence in a condition where the dopant is used alone. However, when the peak of each light-emitting dopant is about 0.1 times greater than the maximum peak, magnitude relation (inequality relation) of the quotients with regard to peak wavelengths is basically not changed even in the mixed condition. Therefore, magnitude relation (inequality relation) between the dopants with regard to the quotient (in the respective peak wavelengths) of the average luminance for the angle in the range of 50° to 70° divided by the front luminance in the mixed condition probably equals to magnitude relation (inequality relation) with regard to the quotient of the average luminance for the angle in the range of 50° to 70° divided by the front luminance in the light-emitting dopants used alone.

Figure 2:
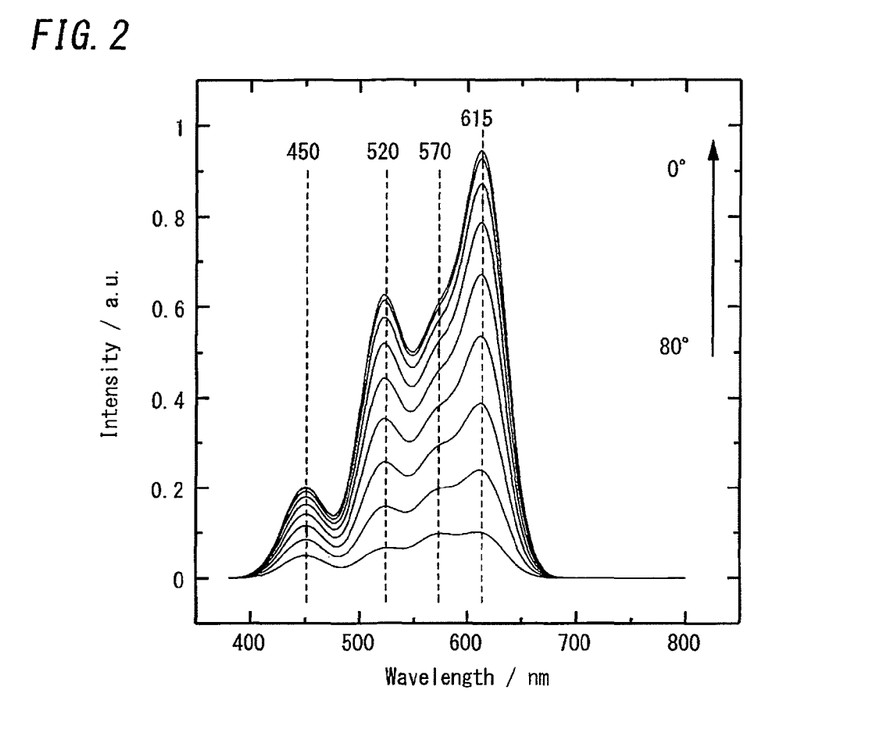
FIG. 2 is a graph showing a relation between a wavelength and an emission intensity.
Figure 3:
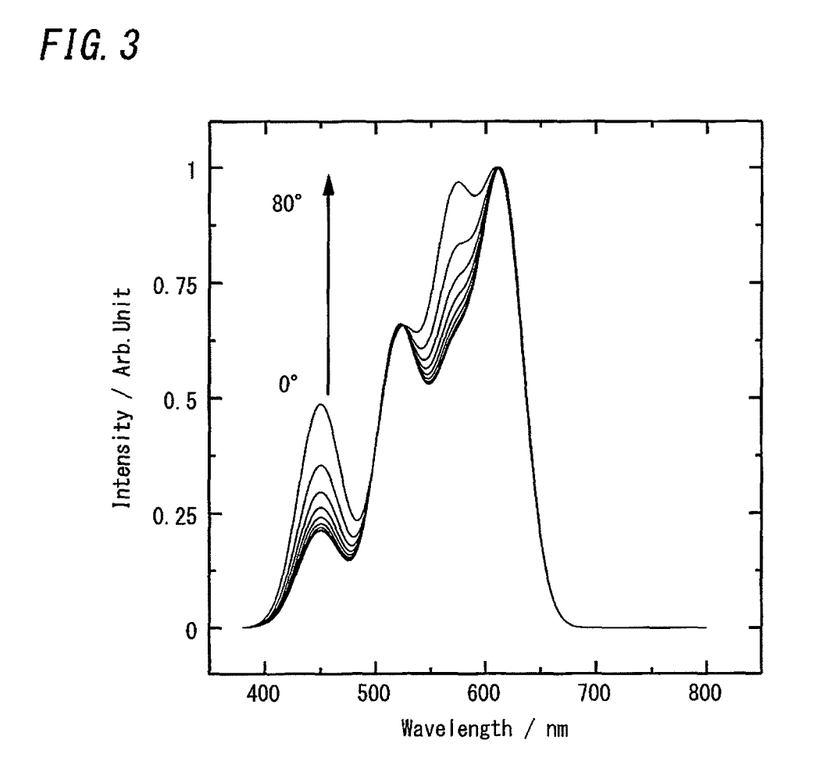
FIG. 3 is a graph showing a relation between a wavelength and an emission intensity.

FIG. 2 shows an angular dependence of an emission spectrum with regard to S2 shown in Table 1. FIG. 3 shows an angular dependence of an emission spectrum (normalized at the wavelength of the maximum intensity) with regard to S2 shown in Table 1. According to the present simulation based on the sum of the light-emitting dopants "A", "B", "C", and "D" shown in FIG. 2, given the wavelengths are 450 nm, 520 nm, 570 nm, and 615 nm, the quotients (each quotient is defined as the quotient of the average luminance for the angle in the range of 50° to 70° divided by the front luminance) are confirmed as 1.16, 0.81, 0.97, and 0.81, respectively. Therefore, in the sum of the spectra of the light-emitting dopants for four colors, the relations defined by the following inequations are concluded to be satisfied: the quotient (in the peak wavelength of the light-emitting dopant "A") of the average luminance for the angle in the range of 50° to 70° divided by the front luminance>the quotient (in the peak wavelength of the light-emitting dopant "D") of the average luminance for the angle in the range of 50° to 70° divided by the front luminance; and the quotient (in the peak wavelength of the light-emitting dopant "C") of the average luminance for the angle in the range of 50° to 70° divided by the front luminance>the quotient (in the peak wavelength of the light-emitting dopant "B") of the average luminance for the angle in the range of 50° to 70° divided by the front luminance.

With regard to S2 shown in Table 1, the peak wavelength of the light-emitting dopant "C" is 570 nm and the radiation distribution is Lambertian ($n_c=1$). In a simple condition that the light-emitting dopant "C" only contributes, the quotient of the average luminance for the angle in a range of 50° to 70° divided by the front luminance must be 1.0. Therefore, respective angular dependences regarding luminance in the wavelengths of the light-emitting dopants in a spectrum that is the sum of four kinds of the dopants are surely different from those of the light-emitting dopants when each of them is used alone. However, the effect is not so strong enough to change the magnitude relation of the quotients between the dopants where each quotient is defined as the quotient of the average luminance for the angle in the range of 50° to 70° divided by the front luminance. It is probably because that angular dependence of a light-emitting dopant that emits light with a peak wavelength is mainly affected by a dopant emitting light with this peak wavelength.

Then, a relation between a peak wavelength and viewing angle dependence was examined.

Figure 4:
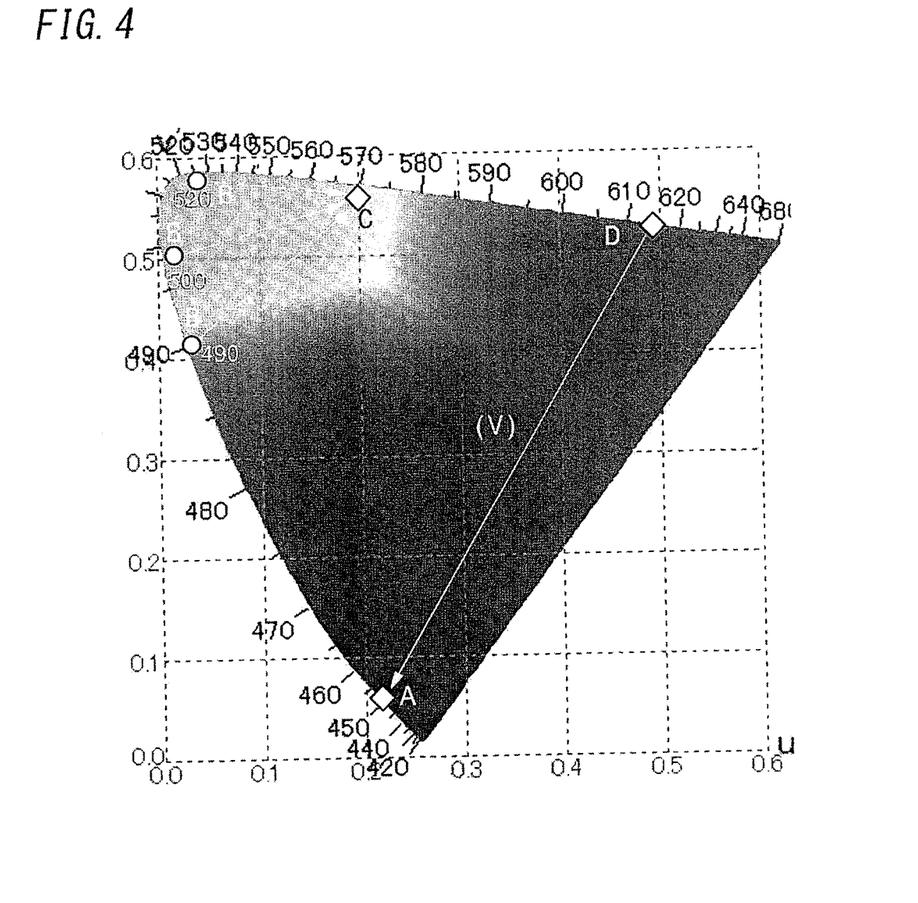
FIG. 4 is a chromaticity diagram having a diamond mark indicating a coordinate in the u'v' colorimetric system corresponding to a peak wavelength of a light-emitting dopant.

T1, T2, and T3 shown in Table 2 are compared. T1, T2, and T3 show angular dependences of emission colors when the peak wavelength of the light-emitting dopant "B" selected out of the light-emitting dopants "A", "B", "C", and "D" varies. FIG. 4 is a chromaticity diagram having diamond marks indicating respective coordinates in the u'v' colorimetric system corresponding to peak wavelengths of the light-emitting dopants "A", "C", and "D" used in T1. Circle marks in FIG. 4 indicates coordinates in the u'v' colorimetric system corresponding to peak wavelengths of the light-emitting dopant "B" in T1, T2, and T3 which are respectively 520 nm, 500 nm, and 490 nm. Note that the aforementioned coordinate in the u'v' colorimetric system corresponding to the peak wavelength refers to a coordinate corresponding to a sharp peak (its standard deviation is 1 nm) of the spectrum in the peak wavelength.

Figure 5:
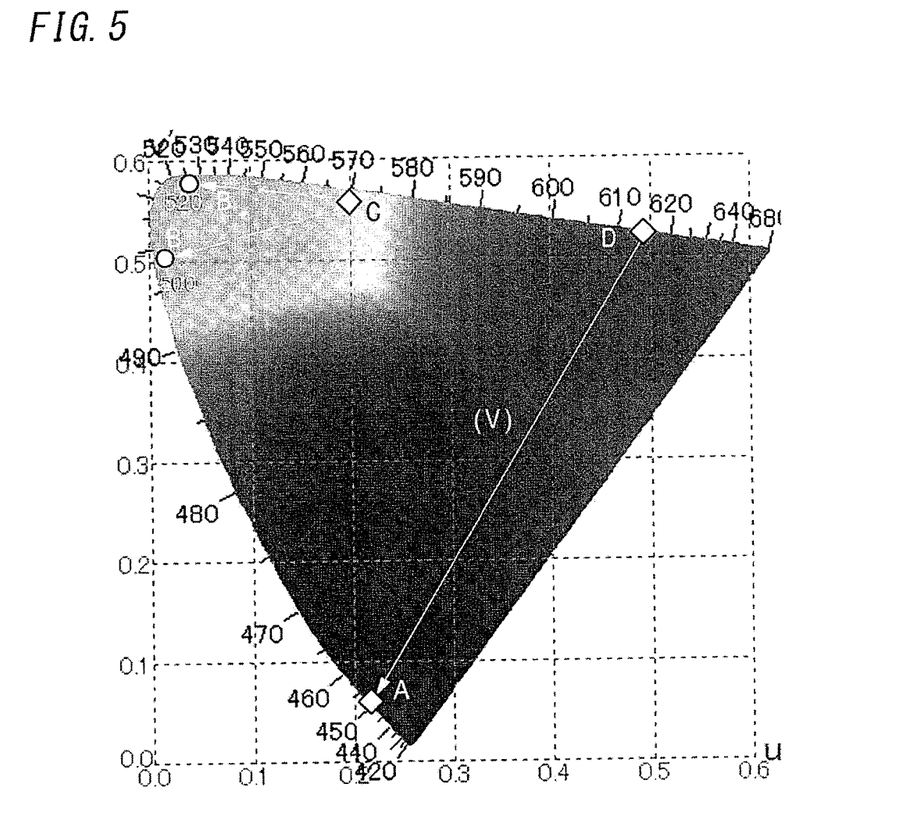
FIG. 5 is a chromaticity diagram having diamond mark indicating a coordinate in the u'v' colorimetric system corresponding to a peak wavelength of a light-emitting dopant.

Given $n_A=0.8$ and $n_D=1.3$ with regard to each of T1, T2, and T3, the emission color becomes likely to be susceptible to the light-emitting dopant "A" rather than to the light emitting dopant "D" toward 80° from 0°. When a vector is defined in the u'v' colorimetric system as having an initial point indicating color at 0° and a terminal point indicating color at 80°, color changes along a vector (V) (a vector DA) shown in FIG. 4 as the change in angle from 0° to 80° in a relation between the light-emitting dopant "A" and the light-emitting dopant "D". Then, in order to suppress changes in color along the vector DA with an aid of the remaining colors, changes in color along a direction from "B" to "C" (a vector BC) can probably suppress changes in color of (V), while there are some possibilities of the light-emitting dopant "B" that are shown respective coordinates in FIG. 5.

In Table 2, α is defined by the following formula (4) and has unit of degrees (note that, coordinates of "A", "B", "C", and "D" are defined in the CIE colorimetric system).

[Math. 2]

$$\cos\alpha = \left|\frac{\vec{DA}\cdot\vec{BC}}{|\vec{DA}||\vec{BC}|}\right| \qquad (4)$$

In Table 2, β is defined by the following formula (5) and has unit of degrees (note that, coordinates of "A", "B", "C" and "D" are defined in the u'v' colorimetric system).

TABLE 2

| | | T1 | T2 | T3 | U1 | U2 |
|---|---|---|---|---|---|---|
| A | Center wavelength $\lambda_{pA}$ (nm) | | | 450 | | |
| | Standard deviation $\sigma_A$ (nm) | | | 20 | | |
| | Intensity $P_A$ | | | 0.2 | | |
| | $n_A$ | | | 0.8 | | |
| B | Center wavelength $\lambda_{pB}$ (nm) | 520 | 500 | 490 | 520 | 500 |
| | Standard deviation $\sigma_B$ (nm) | | | 20 | | |
| | Intensity $P_B$ | | | 0.6 | | |
| | $n_B$ | | 1.3 | | 1.0 | |
| C | Center wavelength $\lambda_{pC}$ (nm) | | | 570 | | |
| | Standard deviation $\sigma_C$ (nm) | | | 20 | | |
| | Intensity $P_C$ | | | 0.5 | | |
| | $n_C$ | | 1.0 | | 1.3 | |
| D | Center wavelength $\lambda_{pD}$ (nm) | | | 615 | | |
| | Standard deviation $\sigma_D$ (nm) | | | 20 | | |
| | Intensity $P_D$ | | | 0.9 | | |
| | $n_D$ | | | 1.3 | | |
| α/° (CIE.x, CIE.y) | | 55 | 18 | 4 | 55 | 18 |
| β/° (CIE.x, CIE.y) | | 51 | 38 | 17 | 51 | 38 |
| Front chromaticity (CIE.x, CIE.y) | | 0.431, 0.438 | 0.423, 0.387 | 0.416, 0.354 | 0.431, 0.438 | 0.423, 0.387 |
| Chromaticity change CIE.x | | 0.031 | 0.030 | 0.028 | 0.066 | 0.069 |
| Chromaticity change CIE.y | | 0.034 | 0.021 | 0.012 | 0.025 | 0.041 |
| Front chromaticity u', v' | | 0.233, 0.355 | 0.249, 0.342 | 0.259, 0.331 | 0.233, 0.355 | 0.249, 0.342 |
| Chromaticity change u' | | 0.007 | 0.011 | 0.014 | 0.031 | 0.030 |
| Chromaticity change v' | | 0.017 | 0.014 | 0.010 | 0.019 | 0.029 |
| Δ(x, y) | | 0.047 | 0.037 | 0.030 | 0.071 | 0.081 |
| Δ(u', v') | | 0.019 | 0.017 | 0.017 | 0.036 | 0.041 |

[Math. 3]

$$\cos\beta = \left|\frac{\overrightarrow{DA} \cdot \overrightarrow{BC}}{|\overrightarrow{DA}||\overrightarrow{BC}|}\right| \quad (5)$$

Moreover, α and β denotes angles between the vector DA and the vector BC in the CIE colorimetric system and the u'v' colorimetric system respectively.

The viewing angle dependence of the emission color in the cases where the wavelengths of the light-emitting dopant "B" are 520 nm, 500 nm, and 490 nm were examined as T1, T2, and T3 respectively in Table 2. Both in the CIE colorimetric system and the u'v' colorimetric system, the angles between the vector DA and the vector BC of T1, T2 and T3 are descending (smaller in this order). The viewing angle dependence of the emission color of T1, T2, and T3 are also descending (smaller in this order) in each of the CIE colorimetric system and the u'v' colorimetric system. Note that the viewing angle dependence in the CIE colorimetric system is attached for reference, but the viewing angle dependence in the u'v' colorimetric system in which a distance in a color space is assumed constant is actually important for lighting.

U1 and U2 shown in Table 2 are compared. In each of U1 and U2, the wavelength of the light-emitting dopant "B" selected out of the light-emitting dopants "A", "B", "C", and "D" varies. A series of U1 and U2 is different from a series of T1, T2, and T3 and has a reversed magnitude relation of $n_B$ and $n_C$ against the series of T1, T2, and T3.

Given $n_A=0.8$ and $n_D=1.3$ in the relation of the light-emitting dopant "A" and the light emitting dopant "D", the emission color becomes likely to be susceptible to the light-emitting dopant "A" rather than to the light emitting dopant "D" toward 80° from 0°. When a vector is defined in the u'v' colorimetric system as having the initial point indicating color at 0° and the terminal point indicating color at 80°, color changes along a vector (V) (the vector DA) shown in FIG. 4 in a relation between the light-emitting dopant "A" and the light-emitting dopant "D".

Given $n_B=1.0$ and $n_C=1.3$ in the relation of the light-emitting dopant "B" and the light emitting dopant "C", when the vector is defined in the u'v' colorimetric system as having the initial point indicating color at 0° and the terminal point indicating color at 80°, color changes along a direction from "C" to "B". This series is different from the aforementioned series of T1, T2, and T3 in this point.

Comparison between U1 and U2 teaches that the viewing angle dependence increases with a decrease in the angle between the vector DA and the vector BC in the u'v' colorimetric system as well as in the CIE colorimetric system.

The results shown in Table 2 also teach that the angular dependence of the emission spectrum constituted by the light-emitting dopants "A", "B", "C", and "D" is suppressed by controlling the angular dependences of the light-emitting dopant "B" and the light-emitting dopant "C" along a destructive direction that allows changes in the emission color due to the angular dependence of the light-emitting dopant "A" and the light-emitting dopant "D" to cancel. Moreover, the results teach that the vector DA and the vector BC are preferably parallel or almost parallel where: the vector DA is defined with a coordinate in the u'v' colorimetric system corresponding to the peak wavelength of the light-emitting dopant "A" and a coordinate in the u'v' colorimetric system corresponding to the peak wavelength of the light-emitting dopant "D"; and the vector BC is the vector defined with a coordinate in the u'v' colorimetric system corresponding to the peak wavelength of the light-emitting dopant "B" and a coordinate in the u'v' colorimetric system corresponding to the peak wavelength of the light-emitting dopant "C".

Figure 6:
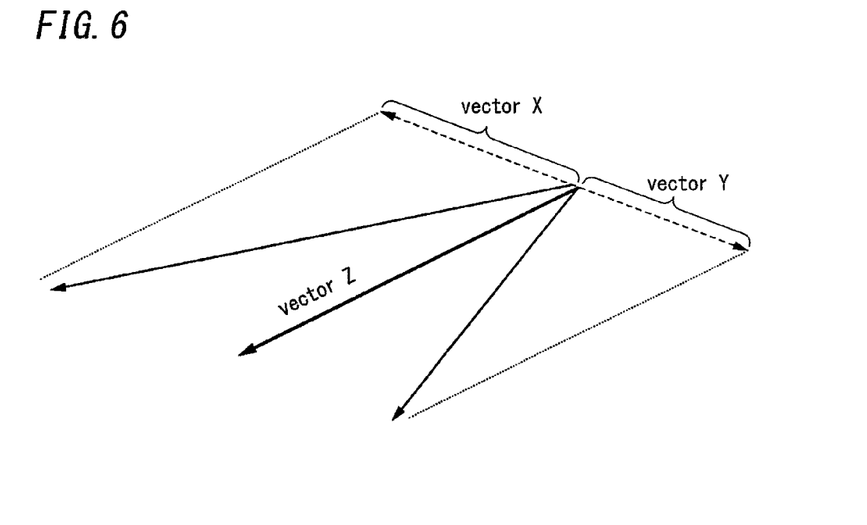
FIG. 6 is a drawing showing a relation of a vector X, a vector Y, and a vector Z.

The "destructive direction" is rephrased in a general manner as follows. As shown in FIG. 6, vectors X and Y are defined as having the same magnitude and opposite directions. Then, it is examined which the smaller one is between a sum of the vector Z and the vector X and a sum of the vector Z and the vector Y.

According to the formula (6), the vector that is the sum of the vector Y and the vector Z is smaller than the vector that is the sum of the vector X and the vector Z.

[Math. 4]

$$|\vec{Z}+\vec{Y}|^2-|\vec{Z}+\vec{X}|^2=2|\vec{Z}||\vec{Y}|(\cos(\gamma)-\cos(\delta))<0 \because |\vec{Y}|=|\vec{X}| \quad (6)$$

(γ: the angle between the vector Z and the vector Y (>90°))
(δ: the angle between the vector Z and the vector X (<90°))

In at least four kinds of the light-emitting dopants, these light-emitting dopants are defined as the light-emitting dopant "A", the light-emitting dopant "B", the light-emitting dopant "C", and the light-emitting dopant "D" in this order from a short wavelength. $(X_a, Y_a)$, $(X_b, Y_b)$, $(X_c, Y_c)$, and $(X_d, Y_d)$ are defined in the u'v' colorimetric system as coordinates corresponding to the peak wavelengths of the light-emitting dopant "A", the light-emitting dopant "B", the light-emitting dopant "C", and the light-emitting dopant "D", respectively. The vector Z is defined as having a terminal point on the coordinate corresponding to the peak wavelength of the light-emitting dopant, which tends to be greater towards 80° from 0° in a relation of the light-emitting dopant "A" and the light-emitting dopant "D", and an initial point on the coordinate corresponding to the peak wavelength of the light-emitting dopant, which tends to be smaller towards 80° from 0° in the relation.

For example, when the relation of the quotient (in the peak wavelength of the light-emitting dopant "A") of the average luminance for the angle in the range of 50° to 70° divided by the front luminance>the quotient (in the peak wavelength of the light-emitting dopant "D") of the average luminance for the angle in the range of 50° to 70° divided by the front luminance is satisfied, the emission intensity of the light emitting dopant "A" becomes greater compared with that of the light-emitting dopant "D" towards 80° from 0°. Therefore, the vector Z is defined as $(X_a-X_d, Y_a-Y_d)$. With regard to the light-emitting dopants "B" and "C", the vector X is defined as the vector in the case where the light-emitting dopant "B" becomes greater towards 80° from 0°, and the vector Y is defined as the vector in the case where the light-emitting dopant "C" becomes greater. In other words, the vector X is defined as $(X_b-X_c, Y_b-Y_c)$ and the vector Y is defined as $(X_c-X_b, Y_c-Y_b)$. Assuming that the chromaticity coordinate of the peak wavelength is always present on the outer edge of the u'v' colorimetric system and that the peak wavelength of the light-emitting dopant "B" is smaller than the peak wavelength of the light-emitting dopant "C", the following relation (7) is provided in a similar manner discussed above.

$$|\vec{Z}+\vec{Y}|^2-|\vec{Z}+\vec{X}|^2=2|\vec{Z}||\vec{Y}|(\cos(\gamma)-\cos(\delta))<0 \because |\vec{Y}|=|\vec{X}| \quad (7)$$

(γ: the angle between the vector Z and the vector Y (>90°))
(δ: the angle between the vector Z and the vector X (<90°))

The vector Y is defined as the vector in the case where the light-emitting dopant "C" becomes greater with regard to the light-emitting dopant "B" and the light-emitting dopant "C".

The description above will be rephrased in a general manner as follows. In at least four kinds of the light-emitting dopants, these dopants are defined as the light-emitting dopant "A", the light-emitting dopant "B", the light-emitting dopant "C", and the light-emitting dopant "D" in this order from a short wavelength. $(X_a, Y_a)$, $(X_b, Y_b)$, $(X_c, Y_c)$, and $(X_d, Y_d)$ are defined in the u'v' colorimetric system as the coordinates corresponding to the peak wavelengths of the light-emitting dopant "A", the light-emitting dopant "B", the light-emitting dopant "C", and the light-emitting dopant "D", respectively. The vector Z is defined as having a terminal point on the coordinate corresponding to the peak wavelength of the light-emitting dopant, which tends to be greater towards 80° from 0° in the relation of the light-emitting dopant "A" and the light-emitting dopant "D" and an initial point on the coordinate corresponding to the peak wavelength of the light-emitting dopant, which tends to be smaller towards 80° from 0° in the relation of the light-emitting dopant "A" and the light-emitting dopant "D". The vector Y is defined as having a terminal point on the coordinate corresponding to the peak wavelength of the light-emitting dopant, which tends to be greater towards 80° from 0° in the relation of the light-emitting dopant "B" and the light-emitting dopant "C" and an initial point on the coordinate corresponding to the peak wavelength of the light-emitting dopant, which tends to be smaller towards 80° from 0° in the relation of the light-emitting dopant "B" and the light-emitting dopant "C". In the present application, it is important that the angular dependences of the light-emitting dopant "B" and the light-emitting dopant "C" are designed such that the angle between the vector Z and the vector Y is obtuse in order to reduce the viewing angle dependence of the emission color of the emission spectrum.

As is obvious from the aforementioned principle, it is preferable that the peak wavelengths of the light-emitting dopant "B" and the light-emitting dopant "C" are present respectively over and under 520 nm, which is the peak of the outer edge of the green region in the u'v' chromaticity graph. In brief, it is preferable that the peak wavelength of the light-emitting dopant "B" is less than 520 nm and the peak wavelength of the light-emitting dopant "C" is more than 520 nm.

In a most preferable embodiment, two lines are to be parallel in the u'v' colorimetric system where one line of the two lines connects the coordinate corresponding to the peak wavelength of the light-emitting dopant "A" with the coordinate corresponding to the peak wavelength of the light-emitting dopant "D" and the other line connects the coordinate corresponding to the peak wavelength of the light-emitting dopant "B" with the coordinate corresponding to the peak wavelength of the light-emitting dopant "C". Furthermore, it is preferable that the peak wavelength of the light-emitting dopant "A" is in a range of 450 nm to 470 nm, the peak wavelength of the light-emitting dopant "B" is in a range of 495 nm to 510 nm, the peak wavelength of the light-emitting dopant "C" is in a range of 540 nm to 580 nm, and the peak wavelength of the light-emitting dopant "D" is in a range of 600 nm to 700 nm in order to obtain a white emission spectrum. Note that various light-emitting materials as the light-emitting dopants including singlet materials and triplet materials for various wavelengths have been developed, and therefore examples of the light-emitting dopant in accordance with the present invention include conventional dopants as well as dopants that will be developed.

In a most preferable embodiment in accordance with the present invention, when the line connecting the light-emitting dopant "A" with the light-emitting dopant "D" and the line connecting the light-emitting dopant "B" with the light-emitting dopant "C" are parallel or almost parallel and the light-emitting dopants are selected in such a manner to improve color rendering properties, the peak wavelength of the light-emitting dopant "A" is in a range of 450 nm to 470 nm, the peak wavelength of the light-emitting dopant "B" is in a range of 495 nm to 510 nm, the peak wavelength of the light-emitting dopant "C" is in a range of 540 nm to 580 nm, and the peak wavelength of the light-emitting dopant "D" is in a range of 600 nm to 700 nm, respectively The light-emitting dopants "A", "B", "C", and "D" in accordance with the present invention are preferably selected from the following examples, but are not limited and conventional materials are available.

TBP is an example for the light-emitting dopant "A". TBP has a peak wavelength of 442 nm and a coordinate (u',v')= (0.234, 0.035) in the peak wavelength. Coumarin 6 is an example for the light-emitting dopant "B". Coumarin 6 has a peak wavelength of 510 nm and a coordinate (u',v')=(0.005, 0.564) in the peak wavelength. $Bt_2Ir(acac)$ is a green light-emitting dopant and an example for the light-emitting dopant "C". $Bt_2Ir(acac)$ has a peak wavelength of 570 nm and a coordinate (u',v')=(0.203, 0.570) in the peak wavelength. $Btp_2Ir(acac)$ is an example for the light-emitting dopant "D". $Btp_2Ir(acac)$ has a peak wavelength of 620 nm and a coordinate (u',v')=(0.520, 0.522) in the peak wavelength.

With regard to the above materials, TBP is 1-tert-butyl-perylene. $Bt_2Ir(acac)$ is bis(2-phenylbenzothiozolato-N—C2)iridium(III)acetylacetonate, and $Btp_2Ir(acac)$ is bis(2-(2'-benzothienyl)pyridinato-N,C3)iridium(III)acetylacetonate, and coumarin 6 is 3-(2-benzothiazolyl)-7-(diethylamino) coumarin.

Various materials are used for the light-emitting dopants "A" to "D". Examples of the singlet material for the blue region BCzVBi:4,4'-Bis(9-ethyl-3-carbazovinylene)-1,1'-biphenyl), Perylene, TBPe(2,5,8,11-tetra-tert-butylperylene), BCzVB (9H-carbazole-3,3'-(1,4-phenylene-di-2,1-ethene-diyl)bis[9-ethyl-(9C)]), and DPAVBi (4,4'-bis[4-(di-p-tolylamino)styryl]biphenyl). Examples of the triplet material for the blue region include fac-Ir(Pmb)$_3$ (tris(1-phenyl-3-methylbenzoimidazolin-2-ylidene-C,C2') and mer-Ir(Pmb)$_3$ (tris (1-phenyl-3-methylbenzoimidazolin-2-ylidene-C,C2'). Examples of the singlet material for the green to yellow region include coumarin 6 (3-(2-benzothiazolyl)-7-(diethylamino)coumarin, C545T (2,3,6,7-tetrahydro-1,1,7,7,-tetramethyl-1H,5H,11H-10-(2-benzothiazolyl)quinolizino[9, 9a,1gh]coumarin), DMQA (N,N'-dimethyl-quinacridone), BA-TAD ($N^{10},N^{10},N^{10'},N^{10'}$-tetraphenyl-9,9'-bianthracene-10,10'-diamine), and rubrene. Examples of the triplet material for the green to yellow region include Ir(ppy)$_3$ (tris(2-phenylpyridine)iridium(III), Ir(ppy)$_2$(acac) (bis(2-phenylpyridine)(acetylacetonate)iridium(III), and Ir(mppy)$_3$ (tris[2-(p-tolyl)pyridine]iridium(III)). Examples of the singlet material for the red region include DCM2 (4-(dicyanomethylene)-2-methyl-6-julolidyl-9-enyl-4H-pyran) and DCJT (4-(dicyanomethylene)-2-methyl-6-(1,1,7,7-tetramethyljulolidyl-9-enyl)-4H-pyran). Examples of the triplet material for the red region include Ir(btp)$_2$(acac) (bis(2-benzo[b]thiophen-2-yl-pyridine)(acetylacetonate)iridium(III)), Ir(piq)$_3$ (tris(1-phenylisoquinoline)iridium(III)), and Ir(piq)$_3$ (acac) (bis(1-phenylisoquinoline)(acetylacetonate)iridium (III)).

In the ordinary white light-emitting organic electroluminescent element for the organic electroluminescent element, the light-emitting dopant "A" is actually a blue light-emitting material (the peak wavelength is 500 nm or less) and the light-emitting dopant "D" is a red light-emitting material (the peak wavelength is 600 nm or more). The light-emitting dopants "B" and "C" are green or yellow light-emitting materials (the peak wavelengths are between 500 nm to 600 nm). Internal quantum efficiency of an ordinary blue light-emitting material is lower than those of light-emitting materials for other colors. A singlet material as a blue light-emitting material having low internal quantum efficiency but having long lifetime is used because a triplet material as a blue light-emitting material has short lifetime. Therefore, it is preferable that destructive interference in the normal direction and constructive interference in an oblique direction are caused with regard to the emission intensity of the blue light-emitting dopant in a condition that no light-diffusion region is formed on the light-extracting face as described in JP2004-335183 A and then, the light-emitting efficiency of the blue light-emitting dopant is improved by forming the light diffusion layer. In other words, it is preferable that the relation of the quotient (in the peak wavelength of the light-emitting dopant "A") of the average luminance for the angle in the range of 50° to 70° divided by the front luminance>1 is satisfied without the light diffusion layer, and that consequently gain from the light-emitting efficiency of the blue light-emitting dopant is improved with the light diffusion layer.

When there is the light-emitting layer for other color than red, light-emitting efficiency of the red light-emitting layer is usually likely to be higher than that of the light-emitting layer for other color. Therefore, the emission intensity of red is likely to be great in the white light-emitting organic electroluminescent element with high efficiency. In this case, it is preferable that the relation of the quotient (in the peak wavelength of the light-emitting dopant "D") of the average luminance for the angle in the range of 50° to 70° divided by the front luminance<1 is satisfied without the light diffusion layer, and that consequently gain from the light-emitting efficiency of the red light-emitting dopant is reduced with the light diffusion layer.

Note that a distance between a light-emitting layer and the cathode (generally, reflective electrode) defines and controls interference of the light-emitting dopants. Constructive interference in an oblique direction occurs when a relation defined by the formula (8) is satisfied where λ denotes an emission wavelength of a light-emitting layer containing a light-emitting dopant of interest, d denotes the distance between the light-emitting layer and the cathode, and n denotes a refractive index of a layer interposed between the light-emitting layer and the cathode.

[Math. 6]
$$\frac{0.3\lambda}{n} < d < \frac{0.7\lambda}{n} \quad (8)$$

[Math. 7]
$$0 < d < \frac{0.25\lambda}{n} \quad (9)$$

Constructive interference in the normal direction occurs when a relation defined by the formula (9) is satisfied.

Design for optical interference is not limited to such design described above and other conventional techniques are available. Such methods of controlling the quotient of the average luminance value for the angle in the range of 50° to 70° divided by the front luminance to be greater than 1 or smaller than 1 are well known.

The description above is directed to the method for controlling interference in the case where the cathode is the reflective electrode. However, even when the cathode is not the reflective electrode, it is possible to estimate whether constructive interference occurs in the normal direction or an oblique direction by simulation, numerical analysis, or the like for optical interference, and such interference can be controlled by appropriately adjusting the film thicknesses of the hole transport layer, the electron transport layer, and the light-emitting layer.

Optical interference can be controlled by conventional technique and there are documents that describe such techniques with regard to making constructive interference in the normal direction or in the oblique direction for Lambertian, for example, "Organic electroluminescence materials and displays" (published by CMC Publishing Co., Ltd., p. 298-310), "Organic electroluminescence handbook" (published by Realize Science & Engineering Center/Sipec Co., LTD., p. 203-228), JP1994-240227 A, and JP2006-165271 A. Even in the case where the organic EL layer is formed on a substrate having a light diffusion layer, which is integrated, or on a substrate having light diffusion property per se, we can check whether an element is in accordance with the present invention by forming the organic EL layer on a substrate not having light diffusion property in the same conditions, while luminance distribution without the light diffusion layer is not apparent. Moreover, the angular distribution of the luminance is estimated to some extent by cross-sectional observation with a transmission electron microscope or the like to reveal the stacking configuration and the film thicknesses of the layers.

Advantageous effects of the present invention is remarkably exhibited when the light-emitting dopant "A" is a singlet light-emitting material (singlet material) and the light emitting dopant "D" is a triplet light-emitting material (triplet material). In this case, the light emitting dopant "D" emits light with high efficiency than the light-emitting dopant "A". Therefore, in order to improve efficiencies of the white light-emitting organic electroluminescent element and the white light-emitting organic electroluminescent panel including the light diffusion layer, it is preferable that, in a condition that the light diffusion layer is formed, gain from improvement in the light-emitting efficiency of the light-emitting dopant "A" is greater than gain from improvement in the light-emitting efficiency of the light-emitting dopant "D" is. Moreover, the light-emitting dopant "C" may be a triplet light-emitting material. With the light-emitting dopant "A" being a singlet material, it is possible to obtain the white organic electroluminescent element with high efficiency and long lifetime.

When the intermediate connecting layer for connecting the two light-emitting units is interposed between the cathode and the anode, it is preferable that the light-emitting dopant "A", which is a singlet light-emitting material, is contained in the first light-emitting unit, and the light-emitting dopant "D", which is a triplet light-emitting material, is contained in the second light-emitting unit in order to suppress energy transfer. If the light-emitting dopant "C" is a triplet light-emitting material, the light-emitting dopant "C" is preferably contained in the second light-emitting unit. If the light-emitting dopant "B" is a singlet light-emitting material, the light-emitting dopant "B" is preferably contained in the first light-emitting unit. If the light-emitting dopant "B" is a triplet light-emitting material, the light-emitting dopant "B" is preferably contained in the second light-emitting unit.

Particularly in the white light-emitting organic electroluminescent element designed to emit white light having a correlated color temperature in a range of 2000 K to 4500 K, one of the anode and the cathode is preferably the reflective electrode and the first lighting emitting unit is preferably far from the reflective electrode than the second light-emitting unit is. This is because gain from the optical interference of the light-emitting unit close to the reflective electrode (but 50 nm away from the reflective electrode) provides superior light-extracting efficiency than that of another light-emitting unit far from the reflective electrode. As described in JP2000-243573 A, the light-emitting unit close to the reflective electrode has a small degree of interference than the light-emitting unit far from the reflective electrode has, and therefore optical interference of the light-emitting unit close to the reflective electrode provides superior gain. The typical reflective electrode is made of metal (e.g., aluminium). If the light-emitting layer is too close to the metal, an exciton is likely to transfer from the light-emitting layer to metal, and thereby causing quenching. Therefore, from other perspective than optical interference, it is preferable that a distance between the light-emitting layer and the cathode is 30 nm or more. In white light having the correlated color temperature in the range of 2000 K and 4500K, the emission intensity of red is relatively high, and therefore it is preferable that the light-emitting unit close to the reflective electrode includes the light-emitting layer for red.

REFERENCE SIGNS LIST

S White light-emitting organic electroluminescent element
P White light-emitting organic electroluminescent panel
1 Light-emitting unit
2 Light-emitting unit
3 Intermediate connecting layer
10 Anode
11 Cathode
12 Light diffusion layer

The invention claimed is:

1. A white light-emitting organic electroluminescent element comprising:
 a cathode,
 an anode, and
 at least four kinds of light-emitting dopants including a light-emitting dopant "A", a light-emitting dopant "B", a light-emitting dopant "C", and a light emitting dopant "D", the at least four kinds of light-emitting dopants being located between the cathode and the anode,
 wherein
 a peak wavelength of the light emitting dopant "A" is shorter than a peak wavelength of the light emitting dopant "B", the peak wavelength of the light emitting dopant "B" is shorter than a peak wavelength of the light emitting dopant "C", and the peak wavelength of the light emitting dopant "C" is shorter than a peak wavelength of the light emitting dopant "D",
 wherein
 when
 a first luminance is a luminance at the peak wavelength of the light-emitting dopant "A", a second luminance is a luminance at the peak wavelength of the light-emitting dopant "D", a third luminance is a luminance at the peak wavelength of the light-emitting dopant "C" and a fourth luminance is a luminance at the peak wavelength of the light-emitting dopant "B", and
 when
 a normal direction of the white light-emitting organic electroluminescent element is in the 0° direction;
 a first average luminance is an average luminance of the first luminance in a range of 50° to 70°,
 a second average luminance is an average luminance of the second luminance in a range of 50° to 70°,
 a third average luminance is an average luminance of the third luminance in a range of 50° to 70°, and
 a fourth average luminance is an average luminance of the fourth luminance in a range of 50° to 70°, and
 a first front luminance is a luminance of the first luminance in the normal direction,
 a second front luminance is a luminance of the second luminance in the normal direction,
 a third front luminance is a luminance of the third luminance in the normal direction, and
 a fourth front luminance is a luminance of the fourth luminance in the normal direction,
 wherein
 a first ratio of the first average luminance to the first front luminance is more than a second ratio of the second average luminance to the second front luminance, and
 a third ratio of the third average luminance to the third front luminance is more than a fourth ratio of the fourth average luminance to the fourth front luminance.

2. The white light-emitting organic electroluminescent element according to claim 1, wherein:
 the peak wavelength of the light-emitting dopant "B" is between 480 nm and 520 nm; and
 the peak wavelength of the light-emitting dopant "C" is between 520 nm and 580 nm.

3. The white light-emitting organic electroluminescent element according to claim 1, wherein:
 the light-emitting dopant "A" is a blue light-emitting dopant; and
 the light-emitting dopant "D" is a red light-emitting dopant.

4. The white light-emitting organic electroluminescent element according to claim 1, wherein
 the first ratio is more than 1.

5. The white light-emitting organic electroluminescent element according to claim 1, wherein
 the second ratio is less than 1.

6. The white light-emitting organic electroluminescent element according to claim 1, further comprising:
 a first light-emitting unit,
 a second light-emitting unit stacked on the first light-emitting unit, and
 an intermediate connecting layer connecting the first light-emitting unit and the second light-emitting unit, the intermediate connecting layer, the first light-emitting unit and the second light-emitting unit being disposed between the cathode and the anode, wherein:
 the first light-emitting unit includes the light-emitting dopant "A" and the second light-emitting unit includes the light-emitting dopant "C" and the light-emitting dopant "D".

7. The white light-emitting organic electroluminescent element according to claim 6, wherein:
 the first light-emitting unit further includes the light-emitting dopant "B"; and
 the light-emitting dopant "B" is a singlet light-emitting material.

8. The white light-emitting organic electroluminescent element according to claim 6, wherein:
one of the anode and the cathode is a reflective electrode;
the first lighting emitting unit is provided farther from the reflective electrode than the second light-emitting unit is provided; and
the white light-emitting organic electroluminescent element emits white light having a correlated color temperature in a range of 2000 K to 4500 K.

9. The white light-emitting organic electroluminescent element according to claim 1, wherein
an emission spectrum is derived from only the at least four kinds of the light-emitting dopants.

10. The white light-emitting organic electroluminescent element according to claim 6, wherein:
the second light-emitting unit further includes the light-emitting dopant "B"; and
the light-emitting dopant "B" is a triplet light-emitting material.

11. The white light-emitting organic electroluminescent element according to claim 1, wherein:
the light-emitting dopant "A" is a singlet light-emitting material; and
the light-emitting dopant "C" and the light-emitting dopant "D" are triplet light-emitting materials.

12. The white light-emitting organic electroluminescent element according to claim 1, further comprising:
a light diffusion layer scattering light and disposed on one of the anode and the cathode.

13. A white light-emitting organic electroluminescent panel, comprising:
a whitelight-emitting organic electroluminescent element comprising:
a cathode,
an anode, and
at least four kinds of light-emitting dopants including a light-emitting dopant "A", alight-emitting dopant"B", a light-emittingdopant"C",and a light emitting dopant"D", the at least four kinds of light-emitting dopants being located between the cathode and the anode,
wherein
a peak wavelength of the light emitting dopant"A" is shorter than a peak wavelength of the light emitting dopant "B", the peak wavelength of the light emitting dopant "B" is shorter than a peak wavelength of the light emitting dopant "C", and the peak wavelength of the light emitting dopant "C" is shorter than a peak wavelength of the light emitting dopant "D",
wherein
when
a first luminance is a luminance at the peakwave length of the light-emitting dopant "A", a second luminance is aluminance at the peak wavelength of the light-emitting dopant"D", a third luminance is a luminance at the peak wavelength of the light-emitting dopant "C" and a fourth luminance is a luminance at the peak wavelength of the light-emitting dopant "B", and
when
a normal direction of the white light-emitting organic electroluminescent element is in the 0° direction;
a first average luminance is an average luminance of the first luminance in a range of 50° to 70°,
a second average luminance is an average luminance of the second luminance in a range of 50° to 70°,
a third average luminance is an average luminance of the third luminance in a range of 50° to 70° ,and
a fourth average luminance is an average luminance of the fourth luminance in a range of 50° to 70° , and
a first front luminance is a luminance of the first luminance in the normal direction,
a second front luminance is a luminance of the second luminance in the normal direction,
a third front luminance is a luminance of the third luminance in the normal direction, and
a fourth front luminance is a luminance of the fourth luminance in the normal direction,
wherein
a first ratio of the first average luminance to the first front luminance is more than a second ratio of the second average luminance to the second front luminance, and
a third ratio of the third average luminance to the third front luminance is more than a fourth ratio of the fourth average luminance to the fourth front luminance; and
a light diffusion layer scattering light and disposed on a light-extracting face of the white light-emitting organic electroluminescent element.

* * * * *